(12) United States Patent
Charbouillot et al.

(10) Patent No.: US 9,286,207 B2
(45) Date of Patent: Mar. 15, 2016

(54) METHOD OF MANAGING THE ENDURANCE OF NON-VOLATILE MEMORIES

(75) Inventors: Samuel Charbouillot, Saint Maximin la Sainte Baume (FR); Yves Fusella, Aubagne (FR); Stéphane Ricard, Bouc Belair (FR)

(73) Assignee: STARCHIP, Meyreuil (FR)

( * ) Notice: Subject to any disclaimer, the term of this patent is extended or adjusted under 35 U.S.C. 154(b) by 127 days.

(21) Appl. No.: 14/127,914

(22) PCT Filed: Jun. 22, 2012

(86) PCT No.: PCT/FR2012/000251
§ 371 (c)(1),
(2), (4) Date: Mar. 20, 2014

(87) PCT Pub. No.: WO2012/175827
PCT Pub. Date: Dec. 27, 2012

(65) Prior Publication Data
US 2014/0223082 A1    Aug. 7, 2014

(30) Foreign Application Priority Data

Jun. 22, 2011   (FR) ...................................... 11 01929

(51) Int. Cl.
*G06F 13/12*    (2006.01)
*G06F 13/00*    (2006.01)
(Continued)

(52) U.S. Cl.
CPC ............ *G06F 12/0246* (2013.01); *G11C 16/10* (2013.01); *G11C 16/349* (2013.01); *G06F 2212/1036* (2013.01); *G06F 2212/7204* (2013.01); *G06F 2212/7211* (2013.01)

(58) Field of Classification Search
CPC ................. G06F 12/0246; G06F 2212/7004; G06F 2212/7211; G06F 2212/1036; G11C 16/349; G11C 16/10
See application file for complete search history.

(56) References Cited

U.S. PATENT DOCUMENTS 6,191,976 B1 *   2/2001   Smayling et al. .......... 365/185.2
7,106,636 B2 *   9/2006   Eilert et al. ............. 365/189.12
(Continued)

FOREIGN PATENT DOCUMENTS

EP           1 182 669 A2     2/2002
WO          WO 98/28748       7/1998
WO        WO 2007/134133 A2   11/2007

*Primary Examiner* — Henry Tsai
*Assistant Examiner* — Jing-Yih Shyu
(74) *Attorney, Agent, or Firm* — Blakely Sokoloff Taylor & Zafman LLP

(57) ABSTRACT

The invention relates to a method for managing the endurance of a data storage system provided with a set of sectors endowed with a guaranteed native endurance capacity (G), comprising the steps consisting in: —partitioning said data storage system into a plurality of work sectors, and into a plurality of replacement sectors able to form an endurance reservoir, certain of the work sectors being intended to be replaced by replacement sectors when said work sectors are expended after a certain number of programming and/or erasure cycles; —defining an address management area making it possible to retrieve the location of the replacement sectors assigned to expended work sectors; —determining, sector by sector, whether a current work sector is physically expended, and executing a step of replacing this work sector by a replacement sector, only when said current work sector is declared physically expended. This method of managing endurance is in particular characterized in that in order to measure the expenditure of a sector, automatic reading of the quality of erasure of the memory points of the sector with respect to a severized reading criterion (margin Vref.) is carried out, that is to say one which is more severe than a normal criterion (Normal Vref.).

7 Claims, 4 Drawing Sheets

(51) Int. Cl.
*G06F 12/02* (2006.01)
*G11C 16/34* (2006.01)
*G11C 16/10* (2006.01)

(56) References Cited

U.S. PATENT DOCUMENTS

| | | |
|---|---|---|
| 7,804,718 B2 * | 9/2010 | Kim .................. 365/185.29 |
| 2004/0057316 A1 | 3/2004 | Kozakai et al. |
| 2006/0282610 A1 * | 12/2006 | Dariel et al. .................. 711/103 |
| 2007/0174549 A1 * | 7/2007 | Gyl et al. ....................... 711/115 |
| 2007/0208904 A1 * | 9/2007 | Hsieh et al. .................. 711/103 |
| 2007/0294490 A1 | 12/2007 | Freitas et al. |
| 2010/0122015 A1 * | 5/2010 | Fusella et al. ................. 711/103 |
| 2010/0199020 A1 * | 8/2010 | Lin .................... G06F 12/0246 711/103 |
| 2012/0117303 A1 * | 5/2012 | Carannante et al. .......... 711/103 |

* cited by examiner

METHOD OF MANAGING THE ENDURANCE OF NON-VOLATILE MEMORIES

The invention relates to a method for managing the endurance of data storage systems such as for example non-volatile memories and particularly non-volatile memories that can be used in onboard applications. This method, even if it uses some known endurance management mechanisms, discloses a new way of using them to obtain a better result than previous methods. Another purpose is to disclose a very inexpensive solution not requiring any particular memory.

CONTEXT OF THE INVENTION

In the field of computer memories, non-volatile memories are characterised by the fact that they can keep their content even when they are no longer energised. Nevertheless, one of the limitative characteristics of these non-volatile memories is their endurance capacity.

The endurance capacity is defined as the number of times that a memory cell can be erased and written before it can be no longer used correctly. Once "bad", the memory cell can either create problems of stability with stored values, or more simply become unable to read the value that was previously written on it.

This invention is aimed more specifically at improving the endurance capacity of data storage devices as will be described in particular in the case of non-volatile memories.

The Endurance Capacity of Non-Volatile Memories

The endurance capacity is very variable for different types of non-volatile memories ($E^2$PROM, FLASH, MRAM, etc.). There may typically be several thousand erase/write cycles for some FLASH memories, up to several hundred thousand programming and erase cycles on the best of them (FLASH or $E^2$PROM).

This endurance capacity obviously depends on the memory type (for example an $E^2$PROM memory is often better than a FLASH memory in terms of endurance), the technological manufacturing process used (for example a process using an 0.09 μm etching fineness), but it is also very variable for different memory cells (for example, the term memory sector is used rather than memory cell for FLASH memories).

For a given technology, a founder must guarantee a minimum endurance capacity (for example 10 000 cycles). This endurance capacity is called "native endurance" or "guaranteed endurance G". In fact, this is equivalent to checking that the "worst" sectors can support for example 10 000 cycles. Other sectors can support capacities well beyond 10 000 cycles with a variability that can be as high as several hundreds of thousand or even millions of cycles.

This variability in the endurance capacity follows a "Weibull" statistical distribution. Traditionally, endurance management devices do not attempt to take advantage of this statistical distribution. One of the purposes of this invention is to take advantage of this statistical distribution of the endurance capacity of non-volatile memories.

Need for Endurance of Applications

The need for endurance is extremely variable depending on the type of use of the non-volatile memory, as can be seen from the following examples.

Permanent Program Storage

If the NVM (Non Volatile Memory) stores a program that will be executed by a microprocessor (this is the case of the program in onboard systems), the need for endurance is very low because this program will hardly change with time. Historically, this type of content was stored in the ROM memory (not modifiable) that explains why the need for endurance is very low.

File Storage

This is the typical case for Solid State Drive (SSD) memories that are frequently used nowadays in desktop computers or laptop computers, USB keys and MP3 players. The endurance need for this type of application is high but no a priori usage rule can be defined. Statistically, a priori all SSD memory sectors have the same endurance need, however there is an exception for the file allocation table that will be updated every time that a file is modified and therefore will have a much higher endurance need. Note that if an operating system is stored on an SSD type memory, the endurance need for this zone will be fairly low, but a priori not detectable and therefore not usable to reduce the endurance need. Typically, the granularity of files in file storage systems is of the order of 4 kbytes.

Data Storage

In the field of onboard applications for example, the microprocessor will require a data storage zone in addition to the program storage zone. This zone may contain a file storage system (as in the previous example), and also software objects used for frequent operation (buffer zones, work data, etc.). These objects are usually characterised by their small size (of the order of magnitude of one or several CPU words up to a few kbytes) but with an extremely high endurance need. Note that the file allocation table in the previous case (file storage) can be perfectly well included in this definition. The granularity of data will be of the order of one CPU word (typically 16, 32 or 64 bits).

Another purpose of this invention will be to take advantage of the intrinsic characteristics of the different storage types to be able to significantly improve the efficiency of endurance management. A non-limitative example embodiment will be disclosed in the case of onboard systems integrating a CPU and a non-volatile memory.

State of the Art

A number of methods for managing the endurance of non-volatile memories are already known. Without being exhaustive we will summarise some of them and their main characteristics.

Error Correction Code (ECC)

This method consists of adding an ECC (Error Correction Code) extension to each word in the memory. This is used to correct individual errors called "single bit fail" errors that are typical of retention or endurance problems.

Some of the advantages of error correction include the fact that it can multiply the native endurance of each memory sector by a multiplication factor (2 to 4). It can also help to solve other types of problems (for example better resistance to disturbances and better retention, etc.). It is also a fairly simple local process that does not require any additional RAM memory. It only requires an ECC encoder/decoder, with a low cost in logic gates.

On the other hand, error correction also has a number of disadvantages. Thus, it is a method that is very expensive in additional non-volatile memory, typically 25% of the total non-volatile memory may be occupied by ECC. Furthermore, only one hardware implementation is possible. The additional hardware cost must be paid on each memory word regardless of the real endurance need. A correction on more than one bit could be envisaged but at prohibitive costs.

Therefore in summary, ECC is an easily applicable system, capable of improving the native endurance of non-volatile memories artificially but at the price of a large additional silicon area.

Memory Sector Sparing

In this method, a number of sectors are added to the non-volatile memory for use to replace sectors taken out of use. An address translation table has to be used to access replaced sectors at their new location.

This solution has been widely used on hard disk controller circuits, if only to manage defective sectors found when the disk was new or that developed with time.

The advantages of this method include the fact that it is a solution that can be implemented by software. The number of additional sectors can be decided upon as a function of the target need for replacement (the method is said to be modulable or scalable). The disadvantages of this method include the need to use a criterion to determine that a sector is bad. Normally, a cycle counter is used and its output is compared with the guaranteed endurance G given by the memory supplier. Furthermore, this method will not be sufficient if most sectors need endurance greater than the native endurance because the number of additional sectors is limited. Therefore, this method is particularly suitable for a small number of endurance predators.

Moreover, it would be necessary to save (or recreate) the address translation table if there is a power failure. Therefore, additional non-volatile memory should be provided for this purpose. The endurance saving is globalised and limited to N* native endurance, where N is the number of additional sectors. Furthermore, this method quickly becomes more complex if replacement of previously replaced sectors has to be organised.

In conclusion, it is an efficient method relatively inexpensive in hardware and in CPU performances, but the additional endurance capacity is limited by the number of allocated spare sectors. Such a system is disclosed for example in document US 2004/0057316A1.

Wear Levelling

This endurance management method consists of attempting to redistribute the need for endurance as uniformly as possible over a maximum number of sectors in order to take advantage of the native endurance of each. The general technique used for this purpose consists of writing the new content of a sector in a free sector and then invalidating the old sector that in turn becomes free for a subsequent operation. A fairly complex allocation table is necessary to store sector relocalisations.

There are two known possible alternatives of this method:

Dynamic Wear Levelling: in Dynamic Wear Levelling, only active sectors are used (sectors that are updated regularly) together with a spare sector for rotations. This limits the endurance capacity to a subset of the memory. This method is very frequently used in USB keys. Such a method is disclosed particularly in document US 2007/0294490 A1 (Freitas et al.).

Static wear Levelling: in this case, in addition to dynamic Wear Levelling, active sectors are exchanged with inactive sectors from time to time to increase the endurance capacity. This method is used for example in SSD type memories but is much more complex.

The advantages of Wear Levelling include the fact that it can theoretically give a global endurance equal to the sum of the native endurance value of ALL memory sectors. Therefore this method gives the highest possible endurance level. It can handle a large number of endurance predators. And it is a solution that can be implemented by software.

The disadvantages of this method include the fact that global endurance is limited to active sectors (for dynamic Wear Levelling). Otherwise, rotation of inactive sectors has to be organised which very much increases the complexity of the algorithms as in the case of static Wear Levelling. Furthermore, there is a reduction in memory access performances during rotation of inactive sectors or identification of periods in which rotation may be done in idle time.

Furthermore, since address indirection is generalised to the entire memory, this method also affects code read and execution performances (fetch) if the code is contained in FLASH memory, and not only data read performances (data read). Furthermore, the need for RAM memory to store sector relocalisations is very large. Furthermore, this method imposes the absolute need to know how to recreate the allocation table when the circuit is powered up and therefore to store its content in non-volatile memory in one way or another. Since sector rotation is homogeneous, the method will stop when the weakest of the sectors involved in the rotation reaches the limit of its native endurance.

Disadvantages of the State of the Art

In summary, as can be seen, none of the known endurance management methods is capable of taking advantage of the intrinsic endurance characteristics of memories, nor differences in the endurance need as a function of applications that will use the memories, in a detailed and granular manner. Each known method depends on fixed characteristics such as systematic smoothing of the need for global endurance of the application on a plurality of sectors (wear levelling) or on replacement of sectors as a function of a criterion (sector sparing), but none attempts to take advantage of the important dispersion of the endurance capacity per sector (Weibull curve) or intrinsic endurance needs of applications.

Purpose of the Invention

[1] Consequently one general purpose of the invention is to disclose a method of managing the endurance of a non-volatile memory that is capable of correcting the disadvantages of known endurance management methods in order to improve the global endurance of a memory.

[2] Another purpose of the invention is to use the endurance management system and particularly the system for extraction of the real endurance capacity of each sector to limit the stress applied to memory cells during erasing and thus naturally increases the real endurance capacity of all sectors used.

[3] A more specific purpose of the invention is to disclose a method for managing the endurance of a memory capable of using the real, physical endurance limit of each memory sector in real time to use the maximum possible endurance of each sector without having any a priori about the real limit of each sector and without using endurance guarantees provided by founders.

[4] Another purpose of the invention is to take account of specific endurance needs of applications to obtain a good match between the endurance capacity of the memory and the real need of applications.

[5] Another purpose of the invention is to design a method and a system with extremely low silicon area requirements compared with conventional systems, like that disclosed in US 2004/0057316 A1, while offering much better efficiency.

[6] Another purpose of the invention is to be able to obtain a method and a system that are completely transparent for the end user (the CPU) and with a practically negligible penalty on access performances.

[7] Another purpose of the invention is to be able to change from a non-volatile memory specially developed to manage endurance, and to replace it with a perfectly generic memory.

[8] Another purpose of the invention is to obtain a scalable system in order to allow the end user (the CPU) to make a choice between endurance capacity or usable memory.

SUMMARY OF THE INVENTION

These purposes are achieved by the endurance management method according to the invention.

The invention uses a conventional method of managing the endurance of data storage systems making use of a set of sectors associated with a native endurance capacity (G) guaranteed by the founder, a plurality of working sectors and a plurality of spare sectors capable of forming an endurance reservoir, some of the working sectors being intended to be replaced by spare sectors when said working sectors are bad after a given number of programming and/or erase cycles. The invention also uses a non-volatile memory management zone to store information related to bad sectors and their replacement sectors (this is the translation table). For example, a basic sparing sector method is disclosed in US 2004/0057316 A1 and is repeated in the "State of the art" section of this disclosure. It is shown diagrammatically in FIG. 2.

Conventionally, in this type of method, there is a nonconforming erase detection step of the sector in step 22 followed by a step to replace the bad sector by a spare sector in step 25.

This invention aims at improving the sector sparing method and basic algorithm by a number of additional means summarised below.

A first additional means consists of performing the erase step 22 in a particular manner, using three envisaged methods.

A first method of achieving this could consist of automatically verifying that the values of all memory cells in the erased sector are conforming with the erase using normal read commands, for example using a state machine (FIG. 6). However, this method has the disadvantage that it does not detect limiting erase values for which some bits could change state as a result of bad retention phenomena.

A second method will consist of using the automatic mechanism in the previous method, retrying the read in step 60 in FIG. 6 several times in order to trap an instability.

A third method will consist of using the automatic mechanism in the first method, this time using a read in margin mode for step 60 in FIG. 6, when this mode is available on the memory. This margin mode, known as such and frequently used for testing non-volatile memories to sort sectors not conforming with a manufacturing specification (yield) could be used in an innovative manner to detect a weakness of the sector before it is completely worn. In other words, when a verification has been made correctly in this margin mode, it can be guaranteed that the sector will always be read correctly in normal mode. Therefore, this can solve retention problems described in the first method.

In any case, these three methods can be used to extract the maximum endurance in each sector without taking account of the guaranteed endurance value G or any other fixed criterion (for example a reference value). This helps to achieve the purpose [3] of the invention and to adapt the sector sparing method to the specific nature of the Weibull curve, extracting the maximum possible endurance from each sector. The simplicity and low cost of the verification state machine also help to achieve purposes [5] (low cost) and [6] (transparency and low penalty on performances).

A second additional means combined with the previous means consists of a state machine (FIG. 5) that breaks down the erase time specified by the founder (in other words the time during which a high voltage source is applied to the memory points of the sector to erase them). This second means helps to verify if the erase quantity at intermediate time points is sufficient to be able to stop the erase procedure. This can limit the stress due to the erase on the memory points and thus significantly increase the intrinsic endurance capacity of the sector considered, which helps to achieve purpose [2]. The simplicity and low cost of the state machine managing the breakdown of the erase time can also satisfy purposes [5] (low cost) and [6] (transparency and low performance penalty). It also makes it possible to achieve a much lower average erase time than the founder's specification because usually, only a fraction of the specified erase time will be necessary to erase the sector correctly.

The invention discloses a third additional means that consists of adapting the sector sparing algorithm to the specific needs of applications (purpose [4]). One special implementation of this third means helps to adapt itself to the specific needs of the world of on-board applications. These applications are often characterised by an extremely strong need for endurance on a small number of sectors and a medium or low need on other sectors. The first and second means already make a strong contribution for low and intermediate endurance needs, maximising the intrinsic endurance capacity of all sectors. Therefore for high endurance needs, the invention specifies this third additional means to perform multiple replacements of a single original sector. Thus, the intrinsic capacity of as many sectors as necessary will be added to cover the high endurance need, until there is no longer any available spare sector.

In a first implementation of this third means, this is made possible because a perfectly generic memory is used with a regular structure (purpose [7]), in which there is no physical difference between an original sector and a spare sector. Thus, a spare sector that has replaced an original sector can in turn become an original sector for a subsequent replacement. As shown in FIG. 7, this is achieved using a non-volatile memory management zone 70 in which each element in the zone is specific to a replaced sector and represents the address of the replacement sector. Therefore, by following the path of successive replacements of an original sector, it is possible to finally obtain the most recent version of the original sector after multiple replacements. With this implementation, the most recent version of a replaced sector at the time that the CPU accesses the original sector can be determined.

In a second more optimised implementation of this third means, the path can be reconstructed when the circuit is powered up and the shortcut between the original sector and the final spare sector can be stored in a RAM. This second version of the implementation is more expensive than the first because it uses an additional RAM. On the other hand, it can respect purpose [6] (transparency and low access penalty).

A fourth additional means consists of securing creation of the non-volatile memory management zone. This zone is written at the same time as each replacement is made to store the address of the replacement sector in an element dedicated to the replaced sector. Therefore, if the content of this zone is lost, the memory becomes unusable. This fourth means uses a safety mechanism to guard against the loss of power supply that could cause corruption of the management zone. This mechanism consists of performing the following algorithm as shown in FIG. 7. The first step in this mechanism consists of writing the address of the original sector 73 in a first signature zone 72.

An end of write signature 74 is then written to validate the previously programmed address.

Once these two steps have been completed, element in the management zone 70 associated with the replaced sector is loaded containing the address of the replacement sector.

An end of replacement signature 76 will be programmed again in a second signature zone 71, in order to validate the latter operation.

Since this mechanism is sequenced in time, only one step will be corrupted if the power supply is cut off. Thus, it will be easy to determine the step at which the algorithm terminated and to restart it so that it can be completed.

In general, the addition of one or several of these four additional means to the classical sector sparing algorithm can help to adapt this algorithm to the specific needs of onboard memories, both in terms of high endurance capacity, operating dependability, low access time penalty and low cost constraint.

All purposes [1] to [8] are achieved by the method according to the invention including requirements for generic memory use because no particular memory characteristics are necessary for the various devices. Furthermore, purpose [8] of the scalable system is also achieved because the limit between the original sectors and the replacement sectors can be determined by the end user (the CPU).

Finally, the purpose of the invention is a method of managing the endurance of a data storage system provided with a set of sectors associated with a guaranteed native endurance capacity (G), including the following steps for:

partitioning said data storage system into a plurality of working sectors and into a plurality of spare sectors capable of forming an endurance reservoir, some of the working sectors being intended to be replaced by spare sectors when said working sectors are bad after a number of programming and/or erase cycles;

defining an address management zone to find the location of replacement sectors assigned to bad working sectors;

determining, sector by sector, if a current working sector is physically bad, and performing a step to replace this working sector by a spare sector, only when said current working sector is declared as being physically bad;

this method being characterised in that an automatic read of the erase quality of memory points in the sector is made to be compared with a margin read criterion (Margin Vref.), in other words more severe than a normal criterion (Normal Vref.), to measure the wear of the sector, these margin and normal criteria being as described later.

When the read in margin mode is made correctly, this guarantees that the sector will always be read correctly in normal mode.

According to one advantageous variant of the method, a single pulse to erase a sector is replaced by several shorter sequentially applied pulses, and an erase quality test is performed after each pulse, a working memory sector being declared as being bad if said quality tests remain negative after a maximum predefined number of pulses and tests.

In this way, the stress due to an erase on memory points is limited and the intrinsic endurance capacity of the sector considered is significantly increased.

Ideally, a perfectly generic memory with a regular structure will be used in which there is no physical difference between an original sector and a spare sector. Thus, the number of spare sectors may be determined by the end user as a function of target endurance needs. Furthermore, a working sector replaced by a spare sector itself becomes a working sector that can be replaced when it has reached its physical wear threshold.

The method according to the invention allows for a non-volatile memory management zone to be used for reconstructing the path between replaced sectors and replacement sectors, in which each element in the zone is specific to a replacement sector and is the address of the replaced original sector.

Furthermore, the reconstruction path between the original sector and the replacement sector using the management zone is determined in real time during the access to the original sector.

According to the invention, the path between the original sector and the replacement sector is reconstructed when the circuit is powered up, and the shortcut between the original sector and the final replacement sector is stored in a RAM memory.

According to one preferred embodiment of the method, the method of updating the management zone is designed to resist power supply losses, in order to prevent corruption of said management zone.

Another purpose of the invention is a device for implementing the endurance management method as described above, characterised in that it comprises a memory partitioned into a plurality of working sectors and spare sectors, a zone for managing spare sectors, a logic controller capable of performing the steps in the method described.

Other characteristics and advantages of the invention will become clear after reading the detailed description of the appended drawings in which.

Figure 2:
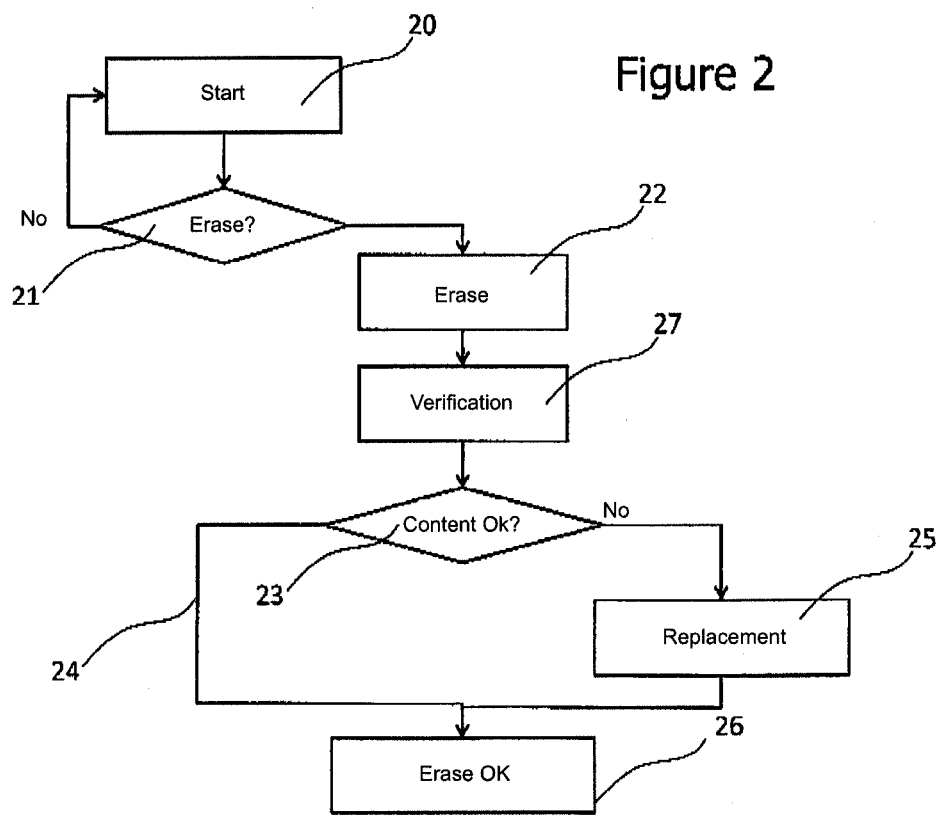
FIG. 2 shows a flow chart of the steps in a known sector sparing method.
Figure 4:
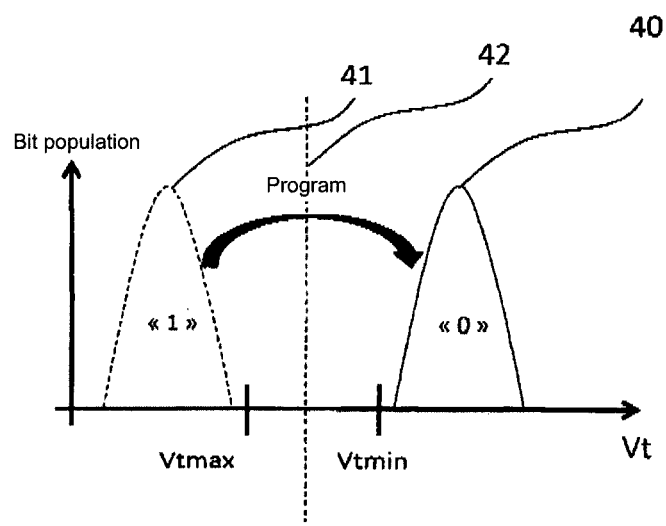
Figure 5:
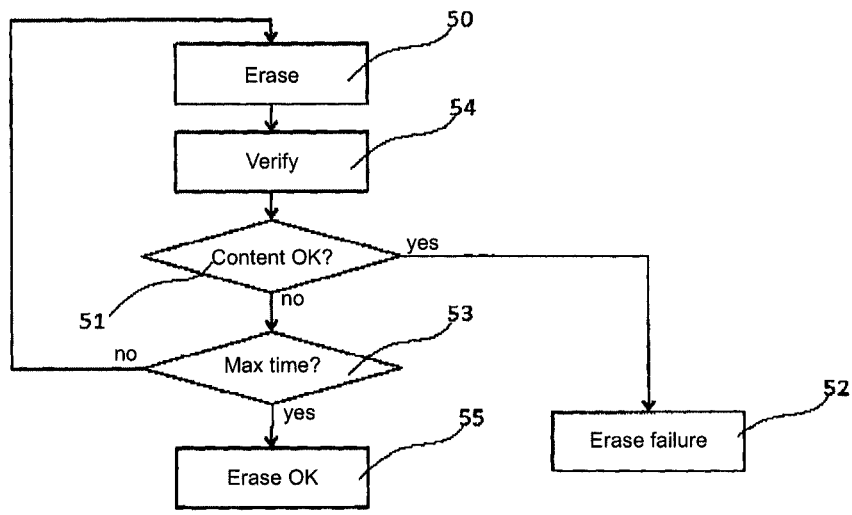
Figure 6:
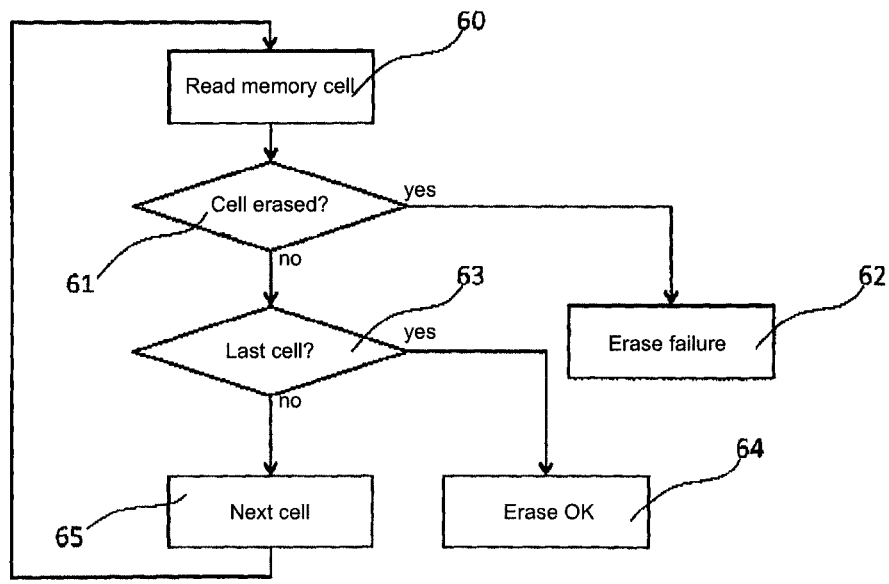
Figure 7:
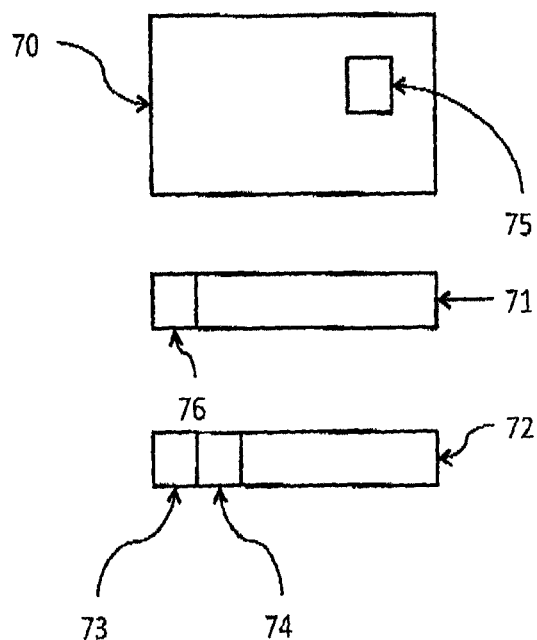

FIG. 4 diagrammatically shows the principle used for measuring the erase quality;

FIG. 5 shows the flow chart of steps corresponding to the erase operation in the flow chart in FIG. 2 in more detail, when said erase is done in several time steps;

FIG. 6 shows a flow chart of steps in an erase verification method, used in a sector sparing method;

FIG. 7 shows a diagrammatic view of the organisation of the management zone and the two signature zones used to reconstruct the path between original sectors and replacement sectors.

Figure 1:
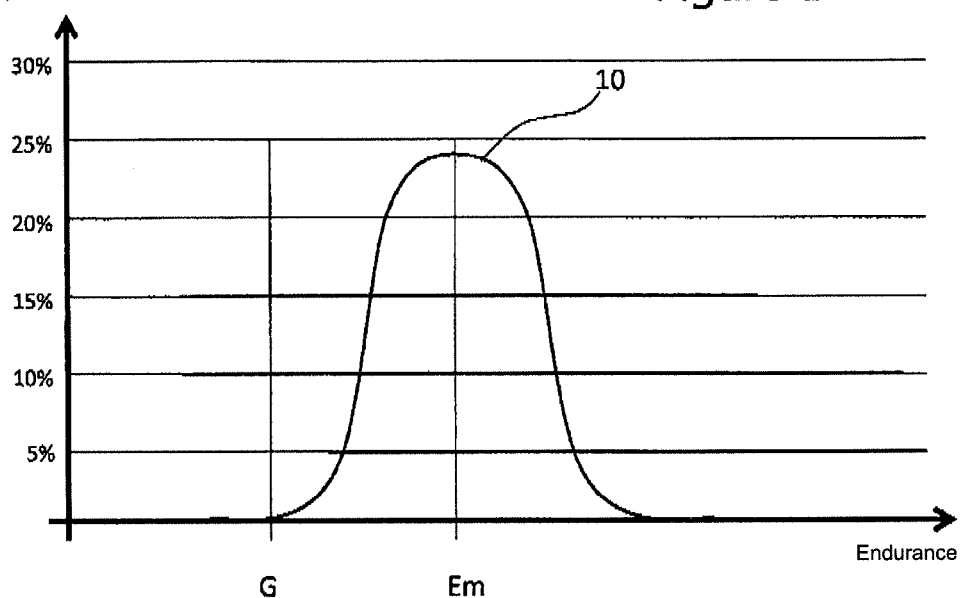
FIG. 1 shows the distribution curve of the native endurance of memory sectors.

Refer to FIG. 1. This figure shows a graph of the statistical distribution of sectors in a memory as a function of their endurance capacity. Therefore, the ordinate shows the percentage of sectors for a given endurance shown on the abscissa. The endurance shown on the abscissa may be expressed as a number of possible erases, which actually represents the endurance capacity of the sector.

As can be seen on graph 10, the distribution of the proportion of sectors as a function of the endurance is Gaussian in shape, distributed around an average value denoted $E_M$, and the endurance of all sectors is higher than the minimum guaranteed endurance for the sectors in this memory also called native or intrinsic endurance and denoted G.

In practice, the memory manufacturer will give a guaranteed endurance value G indicating that the endurance of all sectors is greater than this guaranteed endurance value. In practice, the shape of the endurance curves is very broad (it is not shown to scale in FIG. 1), which means that the minimum endurance value G is very much lower than the mean endurance value $E_M$. One of the essential objectives of the endurance management method according to the invention is to arrange matters such that the minimum endurance value that can actually be used is very much higher, namely several orders of magnitude higher, than it is in the state of the art.

Refer now to FIG. 2 showing a flow chart of steps in the conventional sector sparing method. This method is implemented using a state machine and is applied to a typical sector of the memory.

Starting from a rest state in step 20, it is decided in step 21 whether or not the current sector is to be erased. If it is, then the erase is made in step 22 which consists of sending a sufficient voltage to the current memory sector to erase the cells. Then, a verification of the erase quality is made in in steps 27 and 23 using a verification method chosen from among several available methods. If the result of the erase quality test is good (branch in step 24), go on to step 26 assuming that the erase was done satisfactorily. On the other hand, if the quality of the erase test done in step 23 is bad, it is considered that the current memory sector is bad and it is replaced in step 25 by a good (previously erased) replacement sector which effectively assumes that erase has been done (mark in step 26).

Figure 3:
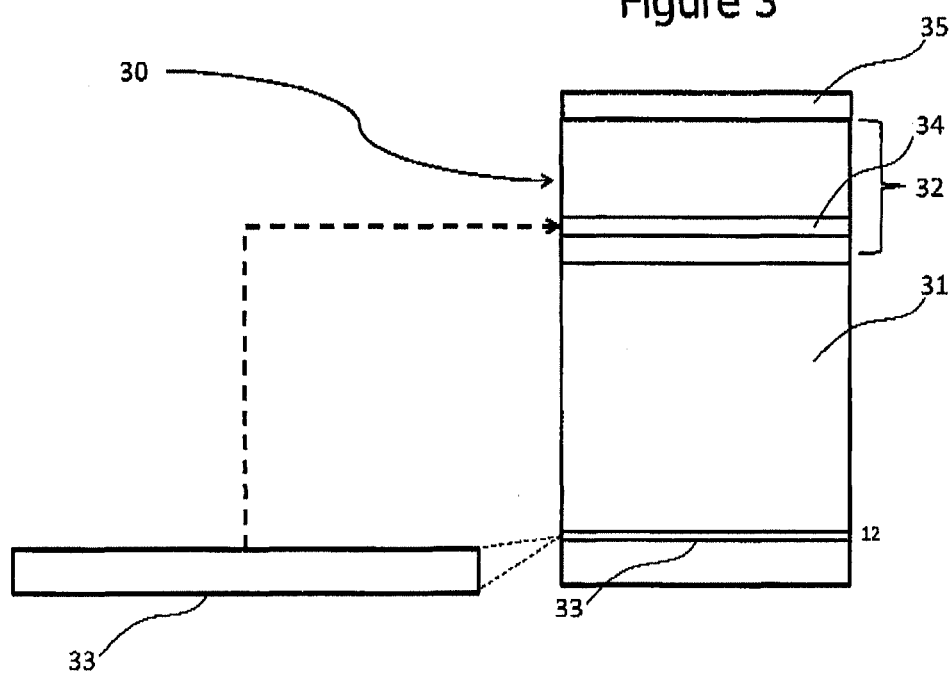
FIG. 3 shows a diagrammatic view of the organisation of a non-volatile memory to which the method according to the invention can be applied.

Refer to FIG. 3 that diagrammatically shows the organisation of a non-volatile memory 30, for example a FLASH type memory comprising a working zone 31 and a spare zone 32, each zone being broken down into sectors, for example working sectors 33 and spare sectors 34. When the erase test applied to the working sector indicates that this sector is bad, this sector is redirected to a given sector among the spare sectors 34 in the spare zone 32. The precise spare sector in the spare zone that will be used for the replacement of the working sector will be determined in an endurance management zone 35 to keep a trace of replacements made.

A working sector 33 in the working memory 31 may be replaced an integer number n of times, where n is less than a number N corresponding to the number of spare sectors 34 contained in the spare zone 32.

The invention allows for sectors 34 in the spare zone 32 to be replaced by other sectors in the spare zone, as for working sectors, which can further increase the endurance capacity of the memory 30.

The method described above is implemented using a logic controller (not shown), an endurance management zone 35, a non-volatile memory 30 and a device (not shown) to measure the wear of memory sectors.

The logic controller may be made in the form of a hardware or software state machine.

The non-volatile memory 30 may be a physical memory or another data storage device.

The measurement device may use a normal read mode or a more severe read mode of the memory or any other device to determine that an erase or programming operation was not done correctly.

An example of a device for measuring the wear of sectors will be described with reference to FIG. 4, in which a graph is shown showing the population of bits in a given sector of the memory on the ordinate, as a function of the threshold voltage Vt of memory transistors shown on the abscissa.

By convention, it is considered that a bit is "programmed" or is level zero when the threshold voltage of the corresponding transistor is greater than a limiting voltage denote $Vt_{min}$ which depends on the technology used for the memory.

Conversely, it is considered that a bit is "erased" or is at level one, when the threshold voltage of the transistor corresponding to this bit is less than a limiting voltage denoted $Vt_{max}$.

As can be seen in FIG. 4, the threshold voltages for a programmed memory point (0) or an erased memory point (1) vary and the corresponding populations of bits equal to zero or one as a function of the applied threshold voltage follow generally Gaussian distributions 40, 41.

In so-called "normal mode" read, the threshold voltage Vt of the current memory point is compared with a fixed reference denoted Normal $V_{ref}$, between the limiting voltages $Vt_{min}$ and $Vt_{max}$ (and diagrammatically shown by a dashed line 42) and the given memory point is deemed to be equal to zero or one as a function of the result of the comparison with the normal reference threshold voltage, Normal $V_{ref}$.

In "margin mode" read, the threshold voltage of the current memory point is compared with another reference denoted Margin $V_{ref}$ (not shown), greater than $Vt_{max}$ but less than the previous reference Normal $V_{ref}$. Consequently, a memory point with a threshold voltage Vt located between the read reference in normal mode, Normal $V_{ref}$, and the read reference in "margin mode", Margin $V_{ref}$, could be considered as having a different value in normal mode (for example a zero instead of a one, or vice versa), but would be considered as a "zero" in margin mode.

These methods of reading the threshold voltage of a memory dot, either in normal mode or in margin mode, may be used in the method according to the invention to measure the erase quality of a sector. They will help to detect if a sector is genuinely erased without considering the theoretical endurance limit of the sector, but on its intrinsic physical qualities. The method also guarantees that the erase verification read is robust.

Refer to FIG. 5 showing a variant of the method to erase a memory sector, in which the normal erase step 22 with a single pulse in the flow chart in FIG. 2 is replaced by an erase with multiple erase pulses.

In general, a memory point is erased by applying a high voltage to it and inputting some energy into it, which eventually destroys it and makes it completely illegible.

In one advantageous embodiment of the invention, only the necessary erase voltage is applied to each memory point, so that the life of each memory point and consequently the life of the endurance reservoir and therefore the entire memory can be increased.

For this purpose, the invention discloses how a single normal erase pulse in step 22 can be replaced by several weaker pulses applied sequentially in step 50 with an erase quality test in step 54 performed after each erase pulse. Weak pulses are applied until the erase quality test is positive as determined by Content Ok? 51, or until a predetermined number of weak pulses have been applied in step 53. If the erase quality test is still bad after application of the maximum predefined number of weak pulses, it is considered that the memory sector is bad in step 55 and it is replaced by allocating a sector in the spare zone.

It can be seen that if the erase quality test gives a good result after a number of pulses less than the maximum predefined number of pulses in step 52, the total quantity of energy applied to erase this sector will be less than the total quantity of energy for a conventional erase, which contributes to extending the life of the memory.

As explained above, the erase quality test can be done in normal mode or in margin mode.

Refer to FIG. 6 showing a conventional erase verification procedure.

In step 60, a memory cell of the erased sector is read and it is then verified in 61 that the memory cell has been correctly erased. If so, the next cell in sector in step 65 is processed, and operations in steps 60, 61 and 65 are repeated until operation in step 63 detects the last cell in the sector. If the last cell in the sector is reached without an erase failure in step 61, it is concluded that the erase is validated in step 64. If the erase fails, it will be terminated by an invalid erase in step 62.

Refer to FIG. 7 showing the method corresponding to the fourth means:

This method uses a management zone 70 and two signature zones 71 and 72.

The first step in this method consists of writing the address of the original sector 73 in a first signature zone 72.

An end of write signature 74 is then written to guarantee validity of the previously programmed address.

Once these two steps have been done, the element in the management zone associated with the replaced sector 75 is loaded with the address of the replacement sector.

An end of replacement signature 76 will be programmed once again in a second signature zone 71, to validate the latter operation.

Advantages of the Invention

The invention as described achieves the fixed purposes. It can achieve very high endurance capacities, almost equivalent to what is possible using so-called Wear levelling methods, but without their disadvantages.

Consequently, the invention is particularly useful in environments in which not all data objects have a high endurance need, which is usually the case particularly in onboard and secure type software applications for which only a small number of objects require high endurance. This method becomes attractive for such case at a very limited cost, but it can be used on any other type of application or known or future storage device with similar endurance needs.

The mechanism to measure the erase quality in comparison with a physical and not just statistical wear criterion is fundamental to achieve high global endurance of the memory. It makes it possible to maximise use of the original sector before having to replace it (and therefore reducing the need for spare sectors), but also the need to maximise the value of the "endurance reservoir".

Application of the erase quality measurement mechanism also makes it possible to apply only the necessary erase voltage to a sector and therefore to maximise its life.

In practice, the number of necessary spare sectors can easily be adjusted depending on the target endurance need.

Furthermore, the method according to the invention can quickly eliminate weak sectors requiring a great deal of endurance, from the endurance reservoir.

The method according to the invention is only slightly penalising in terms of additional memory cost, this cost is actually very low, because it is proportional to the target global endurance and not to the memory size.

The need for RAM memory and control logic is extremely low compared with the needs of so-called dynamic or static wear levelling methods.

The method according to the invention enables optimum use of endurance of sectors forming part of the system. Original sectors that no longer require more endurance than they are capable of providing by themselves never participate in the replacement system (unlike wear levelling, in which all sectors theoretically participate in the system). Therefore there is a drastic reduction in the number of necessary spare sectors due to the optimum use of original sectors.

At the present time, the invention is applicable essentially to non-volatile memories but could be applied to any data storage system in which wear phenomena occur.

The invention claimed is:

1. Method of managing the endurance of a data storage system provided with a set of sectors associated with a native endurance capacity (G), comprising steps for:
   partitioning said data storage system into a plurality of working sectors and into a plurality of spare sectors capable of forming an endurance reservoir, some of the working sectors being intended to be replaced by spare sectors when said working sectors are bad after a number of programming and/or erase cycles;
   defining a non-volatile memory management zone to find a location of replacement sectors assigned to bad working sectors;
   determining, sector by sector, if a current working sector is physically bad, and performing a step to replace this working sector by a spare sector, only when said current working sector is declared as being physically bad; wherein
   an automatic read of an erase quality of memory points in the current working sector is made and is compared with a margin read criterion (Margin Vref.), which is greater than a normal criterion (Normal Vref.), to measure the wear of the current working sector,
   a perfectly generic memory with a regular structure is used if there is no physical difference between an original sector and a spare sector;
   the number of spare sectors is determined by an end user as a function of target endurance needs; and
   a working sector replaced by a spare sector itself becomes a working sector that is replaced when it has reached its physical wear threshold.

2. The method according to claim 1, wherein a single pulse to erase a sector is replaced by several shorter sequentially applied pulses, and in that an erase quality test is performed after each pulse, the current working sector being declared as being bad if said erase quality tests remain negative after a maximum predefined number of pulses and tests.

3. The method according to claim 1, wherein for reconstructing a path between replaced sectors and replacement sectors, the non-volatile memory management zone is used in which each element in the non-volatile memory management zone is specific to a replacement sector and is the address of a replaced sector.

4. The method according to claim 3, wherein the reconstruction path between the original sector and the replacement sector using the non-volatile memory management zone is determined in real time during an access to the original sector.

5. The method according to claim 3, wherein a path between the original sector and the replacement sector is reconstructed when a circuit is powered up, and a shortcut between the original sector and a final replacement sector is stored in a RAM memory.

6. The method according to claim 3, wherein the method of updating the non-volatile memory management zone is designed to resist power supply losses, in order to prevent corruption of said non-volatile memory management zone.

7. Device for implementing the endurance management method of claim 1, comprising a memory partitioned into a plurality of working sectors and spare sectors, the non-volatile memory management zone for managing spare sectors, and a logic controller for performing the steps in the method according to claim 1.

* * * * *